(12) United States Patent
Dannels

(10) Patent No.: US 9,606,210 B2
(45) Date of Patent: Mar. 28, 2017

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-shi, Tochigi (JP)

(72) Inventor: Wayne R. Dannels, Mentor, OH (US)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 99 days.

(21) Appl. No.: 14/747,401

(22) Filed: Jun. 23, 2015

(65) Prior Publication Data
US 2015/0285891 A1    Oct. 8, 2015

Related U.S. Application Data

(63) Continuation-in-part of application No. 14/017,894, filed on Sep. 4, 2013, now Pat. No. 9,476,959.

(30) Foreign Application Priority Data

Sep. 4, 2014  (JP) ................................ 2014-180461

(51) Int. Cl.
G01R 33/48      (2006.01)
G01R 33/561     (2006.01)
G01R 33/565     (2006.01)

(52) U.S. Cl.
CPC ...... *G01R 33/56554* (2013.01); *G01R 33/482* (2013.01); *G01R 33/5611* (2013.01); *G01R 33/5616* (2013.01)

(58) Field of Classification Search
CPC .......... G01R 33/56554; G01R 33/5611; G01R 33/482; G01R 33/5616
See application file for complete search history.

(56) References Cited

U.S. PATENT DOCUMENTS 4,993,075 A    2/1991   Sekihara et al.
7,098,662 B2   8/2006   Hinks et al.
(Continued)

OTHER PUBLICATIONS

Bruder, et al., "Image Reconstruction for Echo Planar Imaging with Nonequidistant k-Space Sampling," *MRM* 23:311-323 (1992).
(Continued)

*Primary Examiner* — G. M. Hyder
(74) *Attorney, Agent, or Firm* — Nixon & Vanderhye P.C.

(57) ABSTRACT

A magnetic resonance imaging apparatus according to an embodiment includes sequence controlling circuitry and image generating circuitry. The sequence controlling circuitry executes a pulse sequence which applies a excitation pulse and then continuously applies a readout gradient magnetic field with alternating polarity thereof and acquires echo signals generated by the pulse sequence continuously from a plurality of receive channels. The image generating circuitry corrects the echo signals so as to generate an image, correcting the echo signals for all of the receive channels collectively on the basis of phase differences between echo signals corresponding to even lines of k-space and echo signals corresponding to odd lines of k-space, and corrects the echo signals for each of the receive channels individually on the basis of magnitude differences between echo signals corresponding to the even lines of k-space and echo signals corresponding to the odd lines of k-space.

11 Claims, 10 Drawing Sheets

(56) References Cited

U.S. PATENT DOCUMENTS

| | | | | |
|---|---|---|---|---|
| 9,476,959 B2* | 10/2016 | Dannels | ............ | G01R 33/56554 |
| 2007/0247151 A1* | 10/2007 | Zur | .................... | G01R 33/5616 |
| | | | | 324/307 |
| 2014/0361770 A1* | 12/2014 | Dannels | ............. | G01R 33/5611 |
| | | | | 324/309 |

OTHER PUBLICATIONS

Chen, et al., "Removal of EPI Nyquist Ghost Artifacts With Two-Dimensional Phase Correction," *MRM* 51:1247-1253 (2004).
Delakis, et al., "MRI Receiver Frequency Response As a Contributor to Nyquist Ghosting in Echo Planar Imaging," *JMRI* 22:324-328 (2005).
Xu, et al., "Robust 2D Phase Correction for Echo Planar Imaging Under a Tight Field-of-View," *MRM* 64:1800-1813 (2010).

* cited by examiner

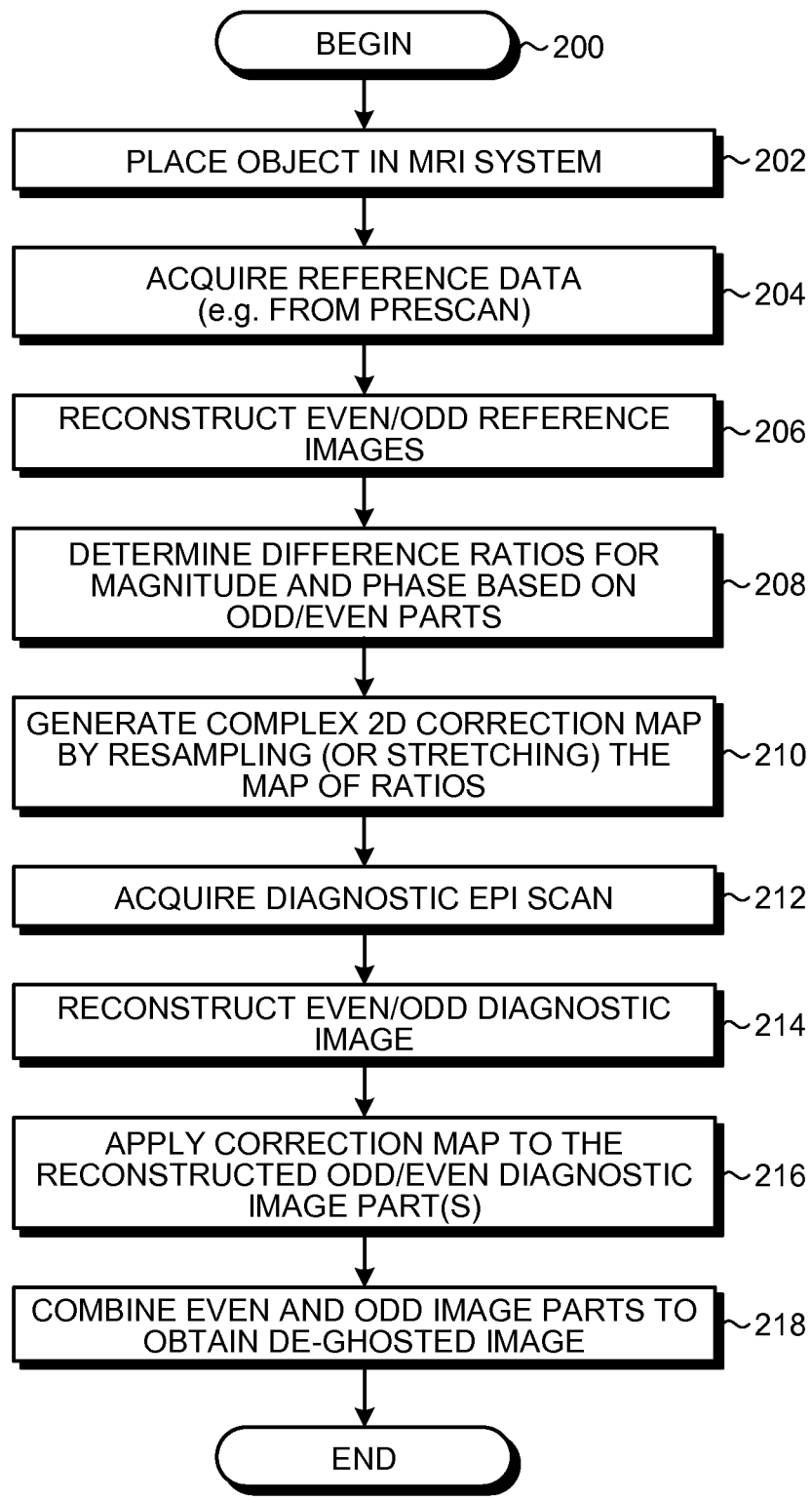

300
REFERENCE SCAN IMAGE,
ONLY EVEN PART OF DATA USED

301
REFERENCE SCAN IMAGE,
ONLY ODD PART OF DATA USED

MAGNETIC RESONANCE IMAGING APPARATUS AND MAGNETIC RESONANCE IMAGING METHOD

This application is a continuation-in-part (CIP) of application Ser. No. 14/017,894 filed Sep. 4, 2013, the entire content of which is hereby incorporated by reference in this application. This application is also based upon and claims the benefit of priority from Japanese Patent Application No. 2014-180461, filed on Sep. 4, 2014, the entire contents of all of which is incorporated herein by reference.

FIELD

The subject matter below relates generally to magnetic resonance imaging (MRI) systems. In particular, the subject matter relates to reducing ghosting artifacts in diagnostic images.

BACKGROUND

Conventionally, an imaging performed by a magnetic resonance imaging apparatus, it is known that a ghosting artifact may arise in an image depending on an imaging method. For example, in an imaging using Echo Planar Imaging (EPI), it is known that, since alternating lines of k-space are collected with alternating gradient readout polarity, a ghosting artifact called Nyquist ghost may arise due to the error that occurs between echo signals corresponding to the even lines and echo signals corresponding to the odd lines.

BRIEF DESCRIPTION OF THE DRAWINGS

FIG. 2 illustrates a flow chart of a method for generating images with reduced ghosting artifacts, in accordance with one or more embodiments.

DETAILED DESCRIPTION

A magnetic resonance imaging apparatus according to an embodiment includes sequence controlling circuitry and image generating circuitry. The sequence controlling circuitry executes a pulse sequence which applies a excitation pulse and then continuously applies a readout gradient magnetic field with alternating polarity thereof and acquires echo signals continuously generated by the pulse sequence from a plurality of receive channels. The image generating circuitry corrects the echo signals so as to generate an image, wherein the image generating circuitry corrects the echo signals for all of the receive channels collectively on the basis of phase differences between echo signals corresponding to even lines of k-space and echo signals corresponding to odd lines of k-space, and corrects the echo signals for each of the receive channels individually on the basis of magnitude differences between echo signals corresponding to the even lines of k-space and echo signals corresponding to the odd lines of k-space.

Figure 1:
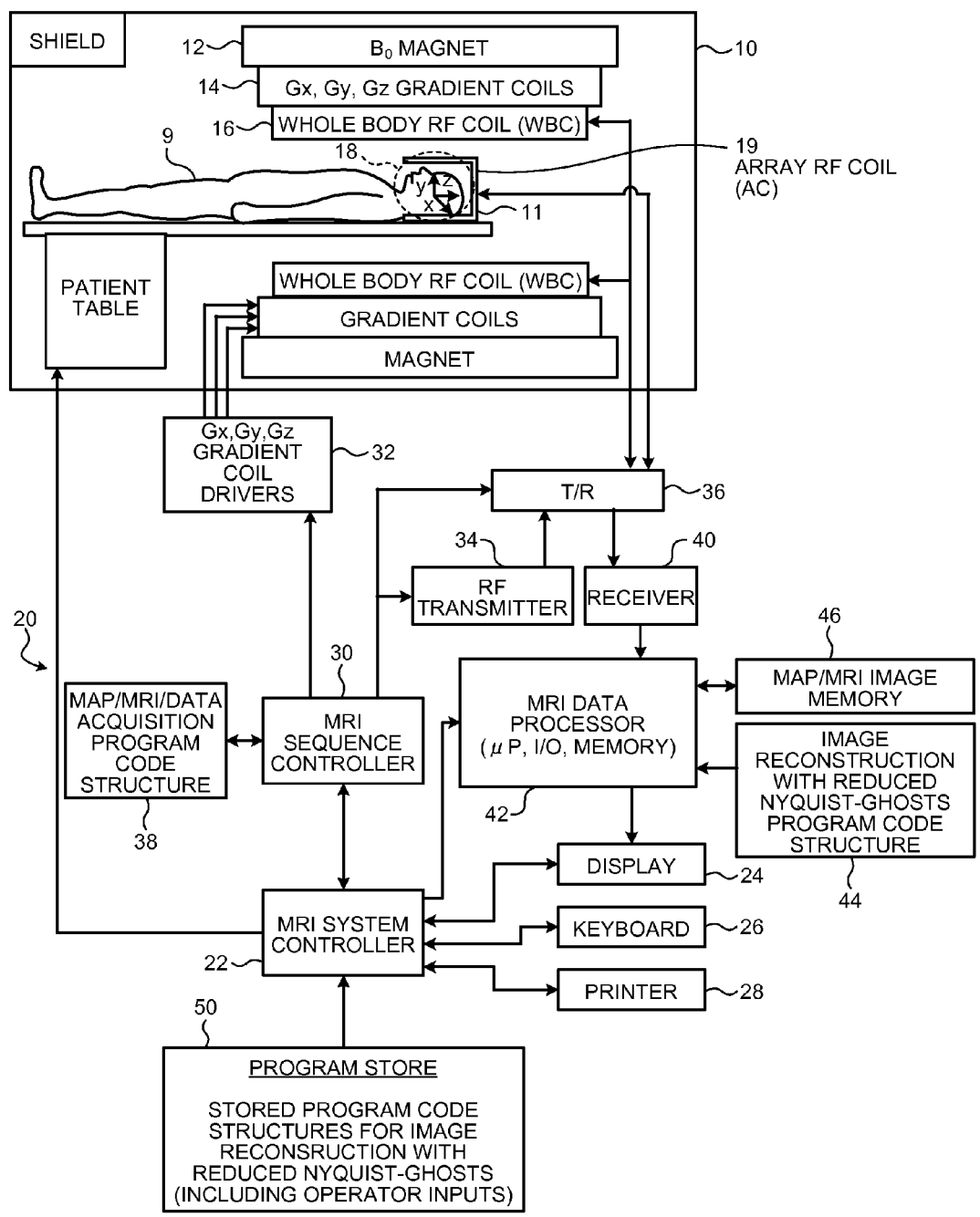
FIG. 1 is a high level schematic block diagram of an MRI system adapted to reduce ghosting artifacts, in accordance with one or more embodiments.

The MRI system shown in FIG. 1 includes a gantry 10 (shown in schematic cross section) and various related system components 20 interfaced therewith. At least the gantry 10 is typically located in a shielded room. The MRI system geometry depicted in FIG. 1 includes a substantially coaxial cylindrical arrangement of the static field BO magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. A smaller array RF coil (AC) 19 might be more closely coupled to the patient head (referred to herein, for example, as "scanned object" or "object") in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils. These may include at least one coil configured to transmit RF signals into the imaging volume and a plurality of receiver coils configured to receive RF signals from an object, such as the patient head in the example above, in the imaging volume.

An MRI system controller 22 has input/output ports connected to a display 24, keyboard 26 and printer 28. As will be appreciated, the display 24 may be of the touch screen variety so that it provides control inputs as well.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques including parallel imaging. For some imaging techniques such as parallel imaging, MRI sequence controller 30 may facilitate a preparation scan (prescan) sequence which is used to determine sensitivity maps for RF coils 16 and/or 19, and a scan sequence to obtain a diagnostic image.

The MRI system 20 includes an RF receiver 40 providing input to data processor 42 so as to create processed image data, which is sent to display 24. The MRI data processor 42 is also configured for access to coil calibration data or other reference data such as that acquired by prescanning and/or system configuration parameters 46 and MRI image reconstruction program code structures 44 and 50.

Also illustrated in FIG. 1 is a generalized depiction of an MRI system program store 50 where stored program code structures (e.g., for image reconstruction with reduced ghosting artifacts, for defining graphical user interfaces and accepting operator inputs to same, etc.) are stored in non-transitory computer readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a correction map generation process, an array of computer readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space, or a system sensitivity difference between portions of a data acquisition procedure). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

The exemplary embodiments described below provide improved ways to generate and display MR images. The embodiments provide for eliminating or substantially reducing ghosting artifacts that occur in imaging techniques such as, for example, echo planar imaging (EPI).

MRI images are formed by acquiring RF response values (e.g., nuclear magnetic resonance (NMR) echo data) for points in k-space. The RF response values are generated by traversing k-space in two or three dimensions (2D or 3D) according to a configured MRI data acquisition pulse sequence. The acquisition of echo data in the frequency-encoding Gro direction (e.g., along the x-axis) is typically rapid and on the order of several milliseconds. However, along the phase-encoding Gpe axis (e.g., y-axis), a different value of the applied phase-encoding gradient Gpe is used to sample each point. Therefore, typically, the acquisition time for an MRI image is largely determined by the number of phase-encoding steps.

EPI is a technique for rapid imaging. EPI applications benefit from being able to take a complete 2D image in a single shot (i.e., one TR (repetition time) interval). After a single excitation, a selected rapid gradient sequence encodes the magnetization repeatedly in order to fill at least half or the entire k-space. Acquiring a complete image in a single shot is highly desired for applications such as, for example, diffusion (e.g., diffusion weighted imaging—DWI), functional MRI (FMRI), and perfusion (dynamic susceptibility contrast (DSC) enhancement or arterial spin labeling (ASL)).

However, EPI requires that alternating lines of k-space are collected with alternating gradient readout polarity. Thus, when EPI is used 2D k space data are acquired using one or a few shots, where each shot covers multiple k-space lines by a sequence of Gro readout gradients with alternating polarities.

In order to fill k-space correctly, every other line is time reversed before a Fourier transform is applied to convert the raw data to an image. Thus, the lines of raw data in k-space include two sets of alternating lines: a set of lines in k-space read in a first direction (e.g., left-right direction) and a set of lines in the second direction (e.g., right-left direction). In this discussion, the set of lines that includes a line traversing the point of origin in k-space is referred to as the set of "even" lines, and the other set as set of "odd" lines. Typically, different imperfect signal modulations or error terms appear on the even lines, compared to the odd lines. This causes a well-known ghost artifact, the "N/2 ghost" or "Nyquist ghost". The Nyquist ghost, a ghost artifact shifted by half the field of view (FOV) in the phase encoding direction of the image, is caused by the even-odd modulation difference varying along the Gpe phase encoding direction (e.g., an alternating modulation along the ky axis in k-space). When this ghost overlaps with the object being imaged, accurate diagnosis may be made difficult.

Several aspects associated with MR data acquisition can contribute to signal inconsistency. Currently, many corrective measures are used to reduce the Nyquist ghost. But, although each corrective measure can reduce the ghost in varying degrees, none correct it fully. Multiple corrective measures are sometimes applied within a single MR acquisition and its reconstruction.

Because EPI applications routinely are used in cases where speed is important, or where multiple encodings are important (many DWI b-values, many FMRI time repetitions, many ASL physiological flow averaging shots, etc.), it is generally not appropriate to increase the number of repetitions to reduce the ghost. Thus, it is generally desirable to use EPI methods where each single excitation pulse (e.g., single TR) generates a single raw image (perhaps with a small number of prior calibration shots).

Because hardware and physiological and safety constraints limit the encoding rate, EPI scans generally have distortions in the phase encode direction. To keep these distortions smaller, readouts must generally be kept short.

These tradeoffs regarding efficient numbers of imaging shots and short readouts render many proposed correction mechanisms impractical for human clinical applications. Effective correction of ghosts, without making compromises of single TR, and without sacrificing fast alternating readout, and without sacrificing the efficiencies to be gained through parallel imaging are extremely important.

With some conventional EPI reconstruction ghost correction methods, ghosting artifact strength where the ghost is on the order 5% to 10% of the underlying correct image intensity even in favorable cases is common. With less favorable conditions, ghosting can increase substantially, at least locally, in images.

Some newer 2D reconstruction corrections which utilize phase corrections yield ghosting levels better than the majority of conventional techniques. These 2D corrections utilize a phase correction parameter that is spatially dependent in the imaging plane. Complex signal phasors are associated with the modulation between "even" and "odd" parts of the data. 2D correction maps or correction values provide for corrections that are spatially varying in the 2D slice, especially when they are not composed of very simple separable corrections in the readout and the phase encode directions. Chen, N K and Wyrwicz, A M. Removal of EPI Nyquist ghost artifacts with two-dimensional phase correction, Magnetic Resonance in Medicine. 2004; 51:1247-1253 ("Chen"), and Xu, D. et al., Robust 2D Phase Correction for Echo-Planar Imaging Under a Tight Field of View, Magn. Reson. Med., 2010 December; 64(6):1800-13 ("Xu"), which are both hereby incorporated by reference in their entireties, provide two such techniques. Chen and Xu characterize the main difference between even and odd echoes as coming from a signal phase difference term, which is described with a spatially varying phase map.

Basic 2D phase corrections for the purpose of EPI ghost artifact reduction, as described above, routinely leave ghosting artifacts of about 2% even under favorable conditions. Embodiments disclosed herein provide for further reducing ghosting, including to levels below the 2% threshold, under a wide range of uncompromised scanning conditions.

In exemplary embodiments, in addition to phase corrections performed in many ghost correction techniques, the magnitude differences in odd and even images are specifically corrected. Correction of magnitude differences, for example, among other aspects, eliminates or reduces effects of frequency response non-flatness observed in many MRI systems, so that Nyquist ghost elimination is further enhanced.

FIG. 2 illustrates a flow chart of a method for generating images with reduced ghosting artifacts due to alternating lines of k-space being collected with alternating gradient readout polarity signals, in accordance with one or more embodiments. In the illustrated embodiment, method 200 includes operations 202-218. In some embodiments, however, one or more of the operations 202-218 may not be performed, or may be performed in an order other than that shown.

At operation 202, the object to be scanned is placed in the MRI system. This operation includes, in addition to placing the object in the MRI gantry in a manner suitable for scanning, configuring the MRI system for executing scanning sequences appropriate for acquiring the desired type of diagnostic images. Configurations may include defining of prescan and main scan sequences, gradient configurations, parameters related to magnitude and phase corrections applied to images, and the like.

At operation 204, reference data is generated by performing a prescan of the object that is located in the MRI gantry. The reference data may also be referred to as calibration data because they may, in many embodiments, be used by the MRI system for various settings of any of several other algorithm corrections or hardware settings, or to help achieve equilibrium magnetization signal, etc. The prescan can be executed in a configurable time period, typically on the order of a few seconds and substantially shorter in duration than a main (diagnostic) scan. The prescan may yield one or more low resolution images for the entire imaging volume (in this case, with the object placed inside) in the scanner, or each of several 2D slice locations to be imaged in a subsequent multi-slice scan. In an embodiment, an EPI scan is performed as the prescan at a lower resolution than the EPI scan to be performed in the diagnostic scan.

In order to ensure that the prescan is performed under identical or almost identical conditions as the corresponding diagnostic scan, the pulse sequence for the prescan may be configured to be identical or nearly identical to the pulse sequence of the diagnostic scan.

For purposes of correction and calibration, it is usually desired that the calibration data is free from aliasing. Therefore, according to an embodiment, the size of the FOV of the prescan is set to at least twice the FOV size of the diagnostic image. Alternatively, the size of the gradient blip in k-space may be set to half the size of a corresponding blip configured for the diagnostic scan, or yet smaller in the case of diagnostic scans with parallel imaging acceleration. Note that an increase factor of the FOV in the image domain is mathematically equivalent to the reduction factor in k space domain of the size of the corresponding gradient blip.

In some embodiments, the prescan is based upon a single shot. For example, all the reference data associated with the post processing of a particular diagnostic scan is obtained from one RF excitation.

In some other embodiments, the prescanning may be based upon more than one shot. Multiple prescan shots may be helpful in making the geometric distortion of the prescan shots the same as in the diagnostic scan. However, in the correction of magnitude differences, multiple prescan shots can cause extra complexity because, for example, magnitude differences can appear naturally in two separate EPI shots separated by TR which is often over a second long. Chen, for example, describes a prescan technique having multiple prescan shots.

At operation 206, an odd reference image and an even reference image are generated from the reference data. The odd reference image is derived from the odd lines in the reference data and the even reference image is derived from the even lines. In an example embodiment, the odd reference image is generated from the odd lines in the reference data by zero-filling data locations corresponding to the even lines. Similarly, the even reference image may be generated from the even lines by, for example, zero-filling the data locations corresponding odd lines. Thus, because the set of odd lines and the set of even lines do not overlap, the odd reference image and the even reference image are generated independently of each other.

The odd and even reference images may be generated by using a 2DFT (2D Fourier transform) on k-space data.

Figure 3A:
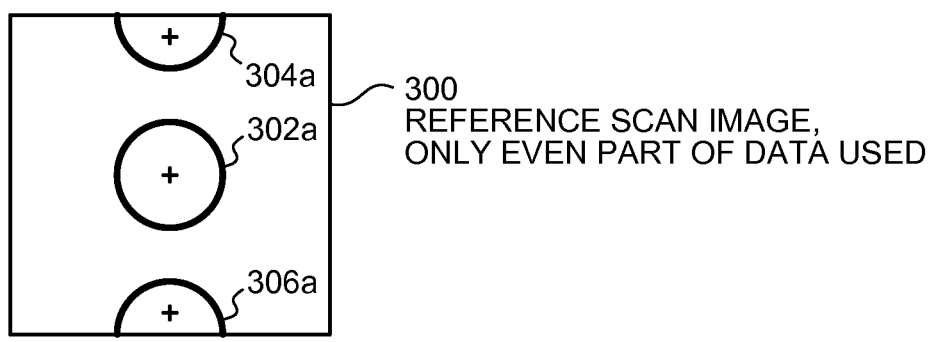
FIGS. 3A and 3B illustrate exemplary sketches of prescan images using echo planar imaging of an object, in accordance with one or more embodiments.
Figure 3B:
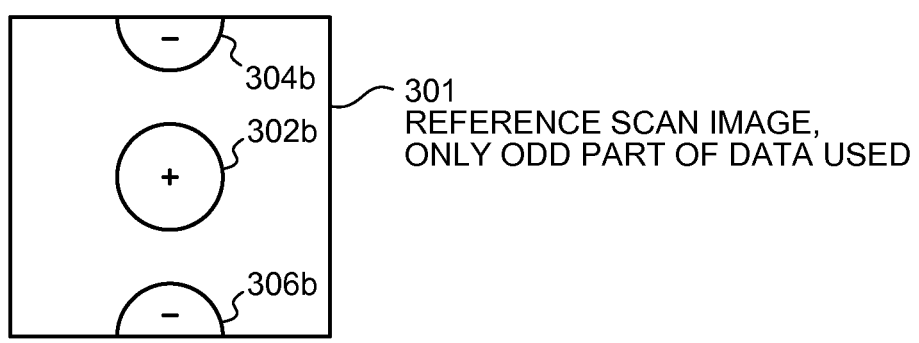
Figure 10:
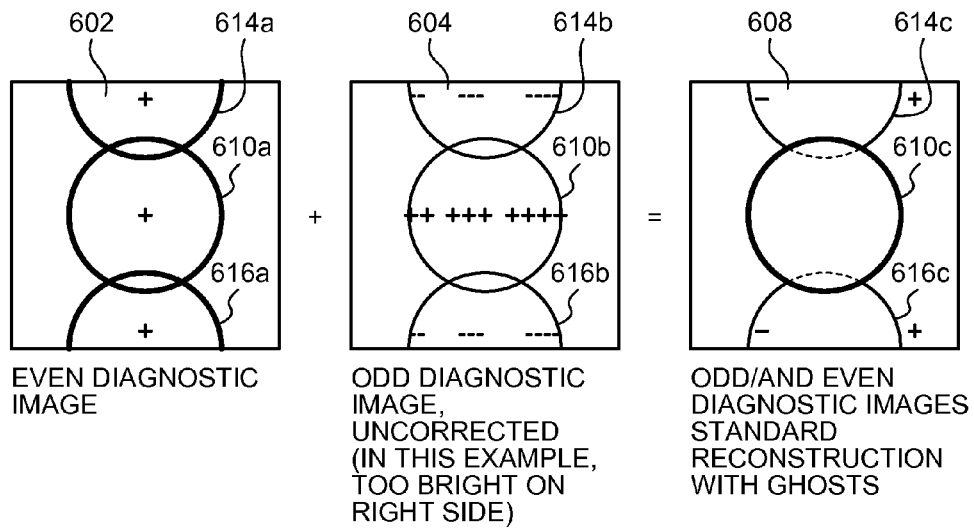
FIG. 10 illustrates example sketches of diagnostic images before reducing ghost artifacts.

FIGS. 3A and 3B are example sketches respectively of an even reference image 300 and an odd reference image 301 generated from a prescan of an object that has a circular shape shown as 302*a* and 302*b*. The circular shape of the object here is for purposes of example, and in practice it would generally be a 2D image, such as of a slice of brain. Items 304*a-b* and 306*a-b* are Nyquist ghosts of object 302*a-b*. The even reference image includes, as shown, a positive object and positive Nyquist ghosts, whereas the odd reference image includes a positive object and negative Nyquist ghosts. If there were no phase or magnitude differences, and if the even and odd reference images were combined, the positive and negative ghosts would cancel out to produce an image free of Nyquist ghost. However, the odd and even reference images include some magnitude and/or phase shift or error due to the alternating readout acquisition that prevents the positive and negative ghosts from completely cancelling out each other. As shown in FIGS. 3A and 3B, the prescan Nyquist ghosts 304a-306a and 304b-306b do not overlap the object. This is because the prescan images have a FOV that is at least double the FOV of the diagnostic image, and therefore the ghost artifacts, which in the diagnostic image would be shifted FOV from the object being scanned, do not overlap the object in the prescan image. Contrasting FIG. 3A with diagnostic images of the same or similar object as shown in FIG. 10 image 602, illustrates the overlap of the object in the diagnostic image and the separation of the ghost artifact such that no overlap exists between them in larger FOV prescan images.

Returning to FIG. 2, at operation 208, magnitude differences and phase differences between the odd reference image and the even reference image are determined. The differences are determined in the image domain, rather than in k-space. For example, the differences may be determined based upon corresponding points (e.g., pixels) subsequent to applying the Fourier transform either in one direction (e.g., y direction in the xy plane) or in both x and y directions. For each pixel position in an odd or even reference image, a difference may be determined. Note that values for magnitude and/or phase exist at each pixel position where there is signal from the object (e.g., each pixel corresponding to a part of the object). The determined differences can be maintained in memory as a ratio of the corresponding odd and even reference image magnitudes, or as a difference between the corresponding odd and even reference image magnitudes.

Figure 4:
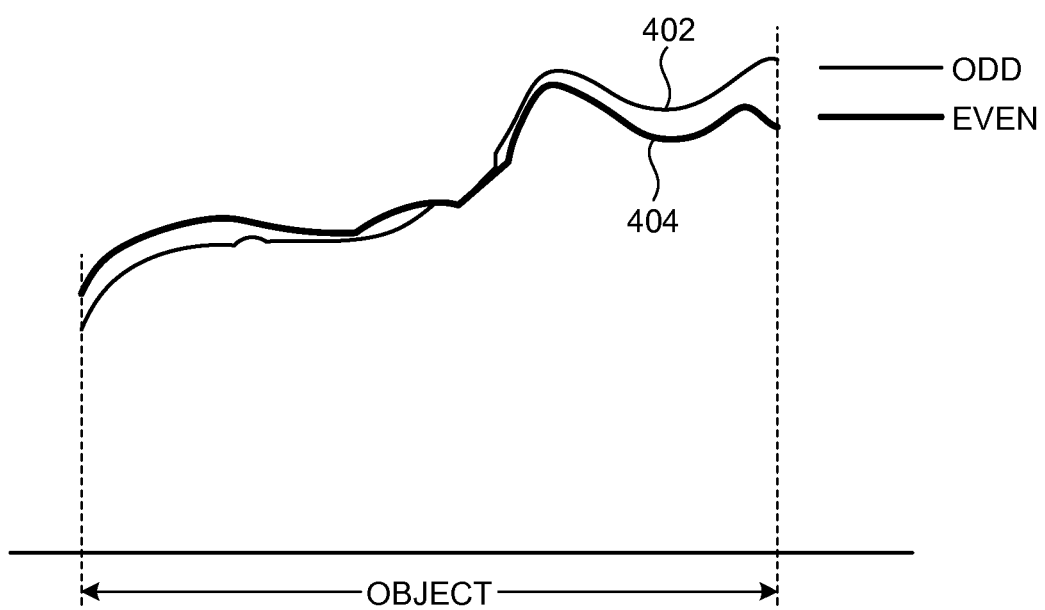
FIG. 4 is an example of changes in magnitude in two prescan images such as those shown in FIGS. 3A and 3B, in accordance with one or more embodiments.

FIG. 4 shows a sketch of a graph illustrating the difference in magnitude between the odd and even reference images in one dimension across the object, for example, along a line or narrow strip along the readout gradient direction. The graph may represent the signal received by one channel in one RF receive coil. The gap between the magnitude 402 of the odd image and the magnitude 404 of the even image at respective pixels, corresponds to the difference in magnitude between the two images. Although FIG. 4 represents the difference in one dimension, persons of skill in the art would understand that the difference may be multi-dimensional with values at each pixel where a signal is received. A two-dimensional difference, for example, can be represented as a surface.

A correction map is formed using the differences in magnitude and the differences in phase in the odd and even reference images. According to an embodiment, the correction map may include a magnitude correction map containing the magnitude difference in the reference images, and a phase correction map which contains the phase differences. In other embodiments, a single correction map may include both magnitude and phase aspects as a respective complex number for each pixel. The correction map may then include the differences as a ratio of complex numbers for each pixel.

Figure 5A:
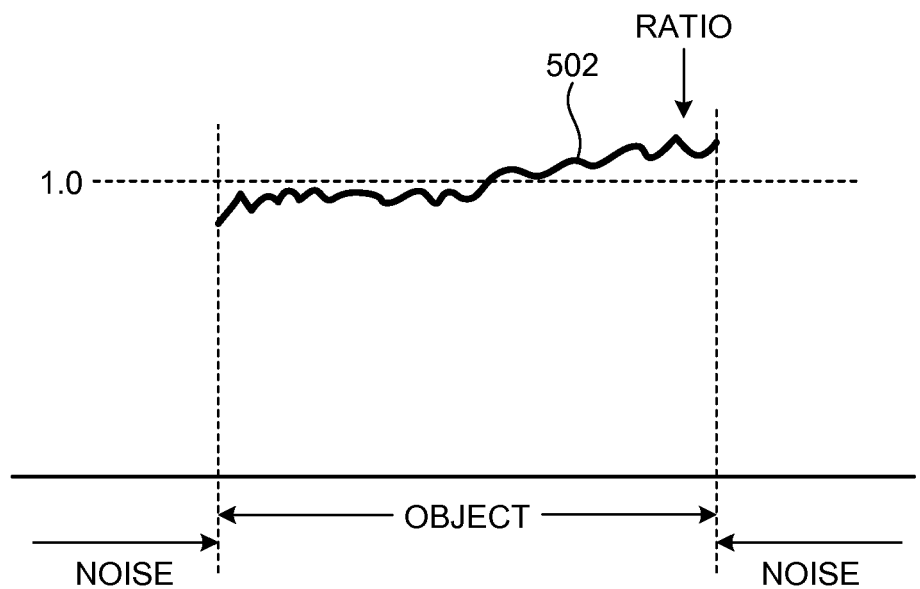
FIG. 5A is an example of changes in a magnitude difference ratio in two prescan images such as those shown in FIGS. 3A and 3B, in accordance with one or more embodiments.
Figure 5B:
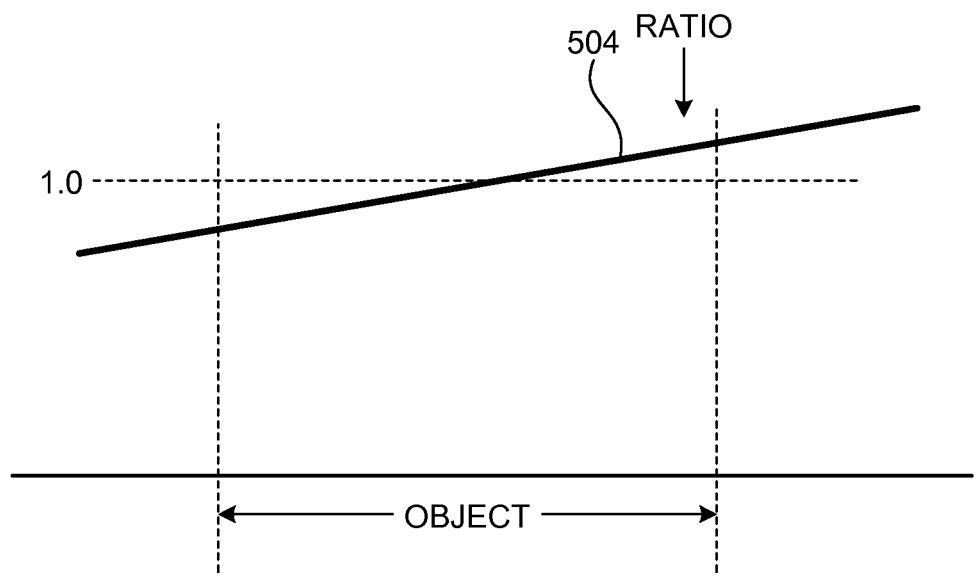
FIG. 5B is an example of a fitted function corresponding to changes in a magnitude difference ratio such as that shown in FIG. 5A, in accordance with one or more embodiments.

Optionally, the difference ratio or a part thereof is fitted to a spatial function. According to an embodiment, the magnitude difference is fitted to a 1D spatial function. An example, difference ratio 502 is shown in FIG. 5A in a 1D profile, for example, along the readout direction of a coil. FIG. 5B shows the ratio in FIG. 5A fitted to a linear function 504. The fitting may include filtering of extraneous values and determining a suitable polynomial. When a fitting function is determined, the ratio may be extrapolated to regions outside of the object's signal. In some embodiments, the difference ratios may be fitted to a non-linear polynomial.

The smoothing, such as that accomplished by fitting the difference ratio to a spatial function, may optionally be performed separately for each of respective RF receive coils or channels. Estimation of the magnitude part of the difference independently on a channel-by-channel basis may yield more accurate corrections because, for example, magnitude modulation may depend significantly on the analog coil and filter characteristics of each coil, including component tolerances, and including electromagnetic coupling to the patient and nearby coils.

In the case where each channel receives from a signal coil loop, and where each loop and channel exhibits a significant frequency dependent gain non-flatness, the even/odd relative magnitude non-flatness may be fitted with a 1D function, which is dependent upon frequency and readout direction location, but which is independent of the PE direction location, and to do so independently for each coil.

Whereas some embodiments fit the magnitude portion of the difference to a function on a channel-by-channel basis, the phase difference may be estimated on a per image basis. In effect, in some embodiments, the phase part of the difference estimation is done using all channels jointly to make one shared phase term. The shared phase term may provide better signal to noise ratio (SNR), and is justified since sources of phase error are often gradient field, eddy currents, etc., which do not depend on the receive channel. Further, the phase difference may be estimated for each of the receive channels.

When, as described above, the magnitude component of the difference is estimated per receive coil (or channel), the difference ratios in the correction map can be updated to comprise the phase term and the per coil magnitude term. According to an embodiment, the per coil magnitude term may be joined to a phase map. Example phase maps are described in Chen and Xu.

Returning to FIG. 2, at operation 210 the correction map is converted to have the same FOV as the diagnostic images. This conversion may require resampling or stretching of the correction map. This conversion may include selecting a central fraction of the ratio image along the PE direction, so as to maintain the primary image and to reject the Nyquist ghosts.

At operation 212, a main scan of the object that is located in the MRI gantry is performed, and MR signal information is acquired in the positive and negative gradient readout polarities. The type of main scan and the sequence of images to be acquired may be configurable. In an embodiment, for example, an EPI main scan is performed using an acquisition sequence substantially similar to the prescan sequence. The data received from this main scan may be considered to have two parts: a part acquired using the positive polarity readout gradient, and the part acquired using the negative polarity readout gradient. As discussed above in relation to the prescan, each of the positive and negative readout gradients acquires alternating lines in k-space. Also as was done in relation to the prescan image, one may refer to the set of lines which includes the line which goes through the origin of k-space (e.g., kx,ky=0,0) as even lines, and to the other set of lines as the odd lines.

At operation 214, odd/even diagnostic images are generated from the diagnostic MR data, for example, using a 2DFT.

At operation 216, one of either the even diagnostic image or the odd diagnostic image is corrected for phase and/or magnitude differences using the corresponding previously constructed correction map. According to an embodiment, the odd image is selected for correction. Each point (e.g., pixel) in the odd image is then multiplicatively corrected based upon the corresponding difference ratio from the correction map. For example, the value of pixel "a" at location x, y in the odd diagnostic image, is multiplied by the value corresponding to pixel "a" in the correction map to yield a corrected value for pixel "a" in the odd diagnostic image. This multiplicative correction may be repeated for each pixel in the odd diagnostic image. The applied correction is intended to adjust the odd image to match the even image. For example, after correction the magnitude difference between even and odd images are eliminated or significantly reduced when compared to the difference before the correction was applied. In some embodiments, however, not all pixels of the odd or even diagnostic image need be corrected using the correction map.

Another embodiment is to split the correction ratio into two equal factors, and to apply half of the correction to the odd image, and the other half of the image correction to the even image. However, splitting the phase component requires great care, because, for example, selecting the correct value from the two possible roots of a complex entity can be nontrivial. Such complexities are avoided when the full correction is applied to only one of the odd and even images, and the other is left uncorrected.

At operation 218, the corrected one of the odd or even diagnostic images is combined with the uncorrected one to yield the final diagnostic image. According to the embodiment where the odd diagnostic image is corrected, the corrected odd diagnostic image is combined with the even diagnostic image to yield the corrected final diagnostic image in which the ghost artifacts including the Nyquist ghost has been eliminated or reduced.

As previously described, estimation of the magnitude differences independently on a channel-by-channel basis may yield more accurate corrections. An example is herein described in detail in which the magnitude differences and the phase differences are estimated for each of the receive channels.

In this case, the MRI sequence controller 30 executes a pulse sequence which applies a excitation pulse and then continuously applies a readout gradient magnetic field with alternating polarity thereof and acquires echo signals continuously generated by the pulse sequence from a plurality of receive channels.

Specifically, the MRI sequence controller 30 sequentially executes a prescan and a main scan as a scan in which a pulse sequence is executed, wherein the pulse sequence applies a excitation pulse and then continuously applies a readout gradient magnetic field with alternating polarity thereof and acquires echo signals continuously generated by the pulse sequence from a plurality of receive channels.

Further, the MRI data processor 42 corrects the echo signals so as to generate an diagnostic image, wherein the MRI data processor 42 corrects the echo signals for all of the receive channels collectively on the basis of phase differences between echo signals corresponding to even lines of k-space and echo signals corresponding to odd lines of k-space, and corrects the echo signals for each of the receive channels individually on the basis of magnitude differences between echo signals corresponding to the even lines of k-space and echo signals corresponding to the odd lines of k-space.

For example, in a case where a RF receive coil which includes a plurality of coils, such as an array coil, is used, the magnitude differences arising between the echo signals corresponding to the even lines of k-space and the echo signals corresponding to the odd lines of k-space are not identical between each coils because magnitude differences arising from Q value set for each coils are different. On the other hand, the phase differences have low dependency on settings of the coils because the phase differences arise mainly due to delay time of the gradient magnetic field, eddy magnetic field, and so on. For this reason, the correction based on the magnitude differences is desirable to be performed for each of the receive channels.

Specifically, the MRI data processor 42 corrects echo signals acquired by the main scan on the basis of phase differences and magnitude differences between echo signals acquired by the prescan. The MRI data processor 42 herein corrects the echo signals for all of the receive channels collectively on the basis of the phase differences and corrects the echo signals for each of the receive channels individually on the basis of the magnitude differences so as to generate a corrected image for each of the receive channels, and combines generated corrected images so as to generate the diagnostic image.

In this process, the MRI data processor 42 generates an even image based on the echo signals corresponding to the even lines and generates an odd image based on the echo signals corresponding to the odd lines for each of the receive channels, corrects either of the even image or the odd image on the basis of the phase differences and the magnitude differences, and combines the image being corrected and the image being not corrected so as to generate the corrected image.

Further, the MRI data processor 42 generates phase correction information including correction values corresponding to the phase differences and magnitude correction information including correction values corresponding to the magnitude differences, and corrects the echo signals for all of the receive channels collectively on the basis of the phase correction information and corrects the echo signals for each of the receive channels individually on the basis of the magnitude information so as to the image.

For example, the phase correction information is herein generated as a phase correction map that includes the correction values being along two dimensional directions. For example, the phase correction map is information in which each of the phase differences is assigned as the correction value to each of the pixels along the readout direction and the phase encode direction. For example, the correction value of each of the pixels of the phase correction map may be determined by fitting the variation of the phase differences in each of the directions to the spatial function.

Further, for example, the magnitude correction information is herein generated as a magnitude correction map that includes the correction values being along two dimensional directions. For example, the magnitude correction map is information in which each of the magnitude differences is assigned as the correction value to each of the pixels along the readout direction and the phase encode direction. For example, the correction value of each of the pixels of the magnitude correction map may be determined by fitting the variation of the magnitude differences in each of the directions to the spatial function.

The phase correction map and the magnitude correction map may be generated separately or may be generated as one correction map by adding both correction maps.

Figure 6:
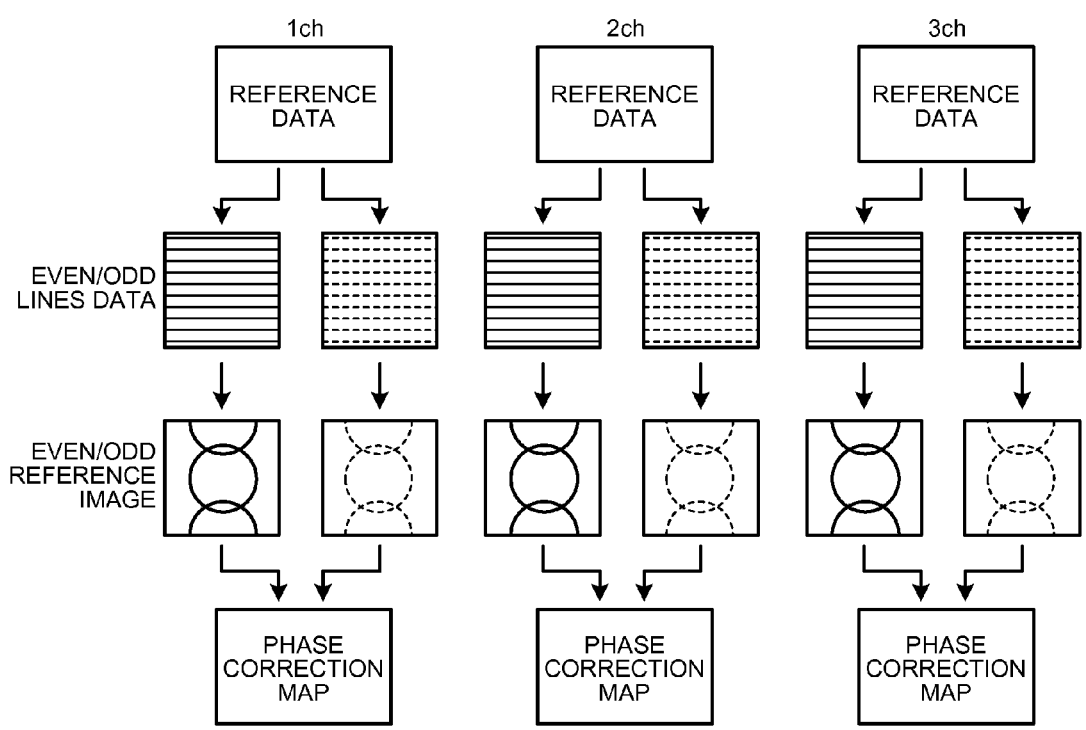
FIGS. 6 and 7 illustrate examples of generating correction maps according to an embodiment.
Figure 7:
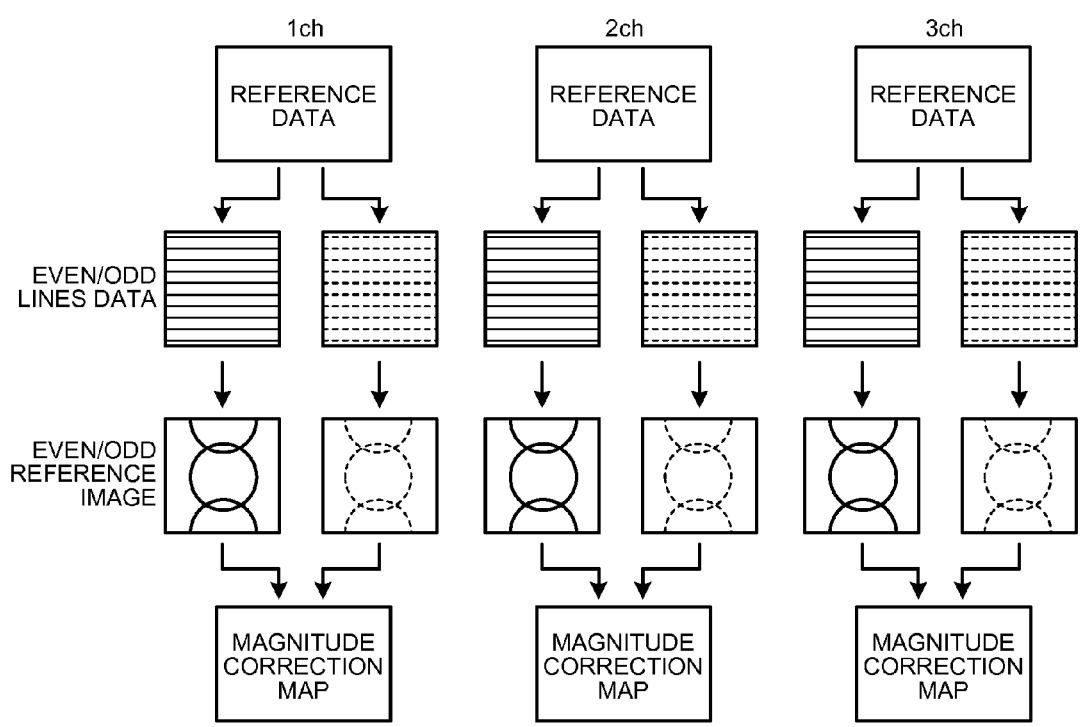

FIGS. 6 and 7 illustrate examples of generating correction maps according to an embodiment. In these figures, the reference data, the even/odd lines data, and the even/odd reference images shown in FIG. 6 are identical with those shown in FIG. 7.

For example, as shown in FIG. 6, the MRI data processor 42 generates an even reference image (the left-hand data of the pair of data illustrated as "EVEN/ODD REFERENCE IMAGE" in FIG. 6) on the basis of the even lines data (the left-hand data of the pair of data illustrated as "EVEN/ODD LINES DATA" in FIG. 6) corresponding to the even lines of k-space with respect to each of the reference data acquired from each of the receive channels.

Further, the MRI data processor 42 generates an odd reference image (the right-hand data of the pair of data illustrated as "EVEN/ODD REFERENCE IMAGE" in FIG. 6) on the basis of the odd lines data (the right-hand data of the pair of data illustrated as "EVEN/ODD LINES DATA" in FIG. 6) corresponding to the odd lines of k-space with respect to each of the reference data acquired from each of the receive channels.

The MRI data processor 42 then generates a phase correction map using the phase differences between the even reference image and the odd reference image for each of the receive channels. Further, for example, as shown in FIG. 7, The MRI data processor 42 generates a magnitude correction map using the magnitude differences between the even reference image and the odd reference image for each of the receive channels.

Figure 8:
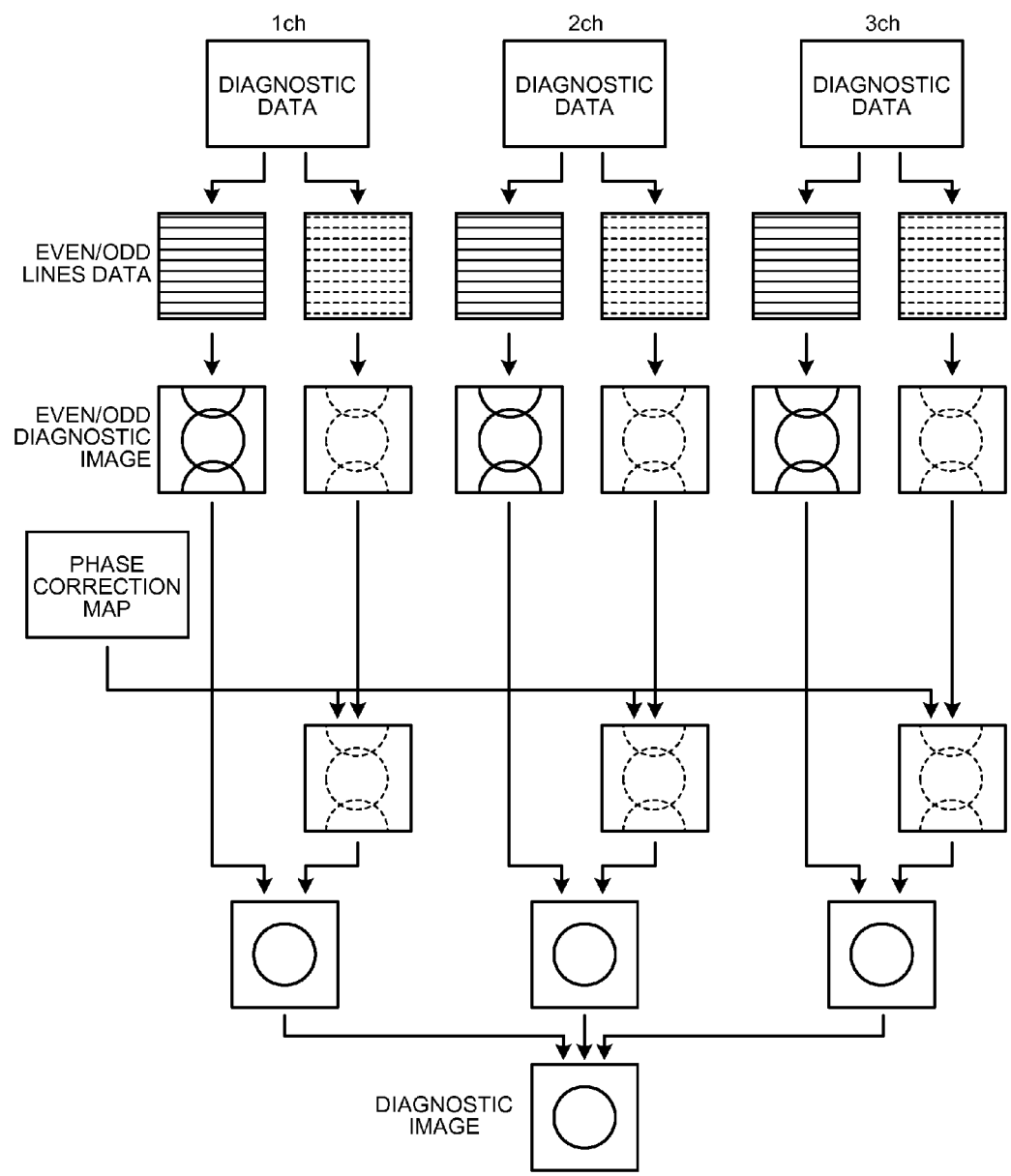
FIGS. 8 and 9 illustrate examples of generating a diagnostic image according to an embodiment.
Figure 9:
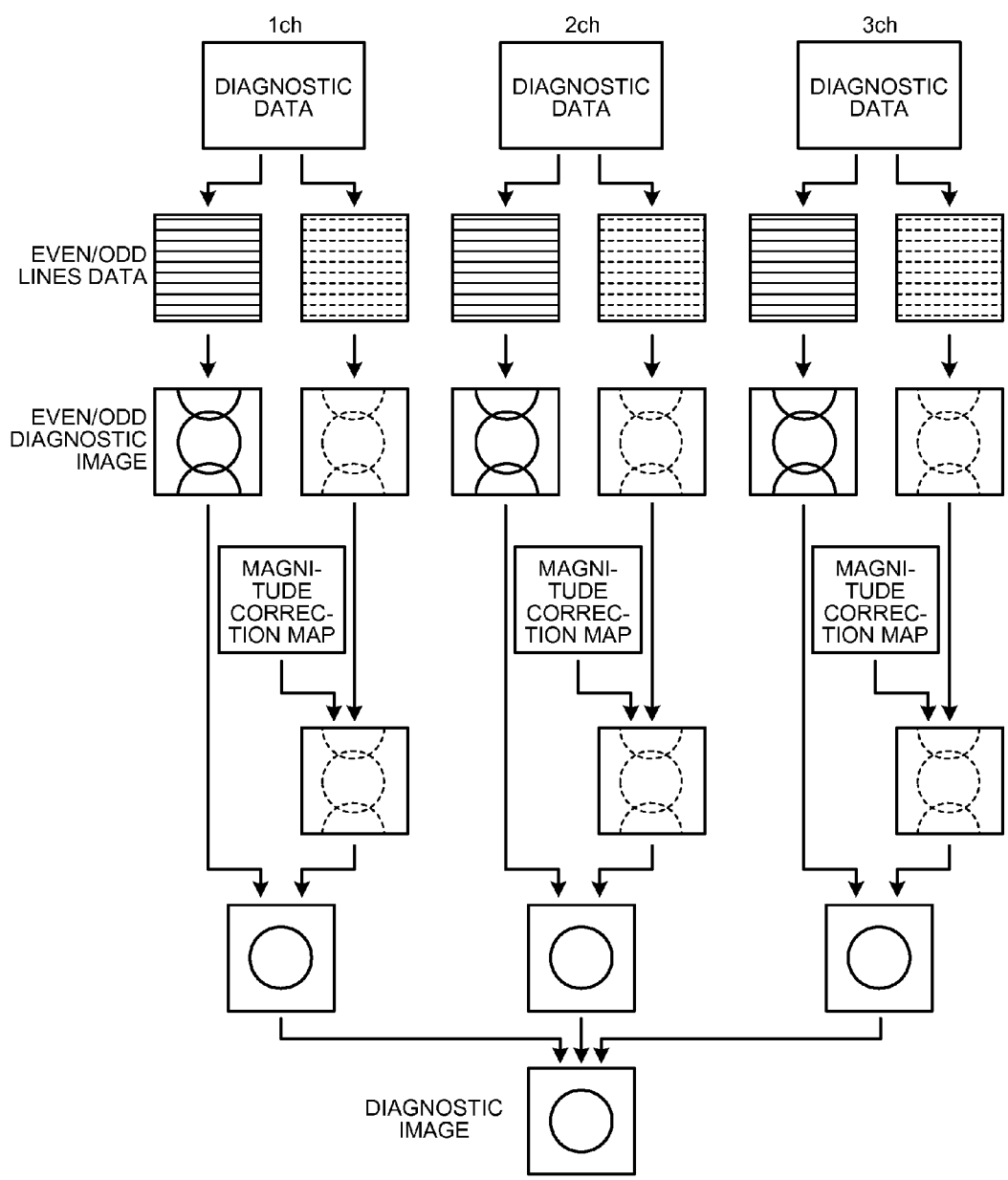

FIGS. 8 and 9 illustrate examples of generating a diagnostic image according to an embodiment. In these figures, the diagnostic data, the even/odd lines data, and the even/odd diagnostic images shown in FIG. 8 are identical with those shown in FIG. 9.

For example, as shown in FIG. 8, the MRI data processor 42 generates an even diagnostic image (the left-hand data of the pair of data illustrated as "EVEN/ODD DIAGNOSTIC IMAGE" in FIG. 8) on the basis of the even lines data (the left-hand data of the pair of data illustrated as "EVEN/ODD LINES DATA" in FIG. 8) corresponding to the even lines of k-space with respect to each of the diagnostic data acquired from each of the receive channels.

Further, the MRI data processor 42 generates an odd diagnostic image (the right-hand data of the pair of data illustrated as "EVEN/ODD DIAGNOSTIC IMAGE" in FIG. 8) on the basis of the odd lines data (the right-hand data of the pair of data illustrated as "EVEN/ODD LINES DATA" in FIG. 6) corresponding to the odd lines of k-space with respect to each of the diagnostic data acquired from each of the receive channels.

The MRI data processor 42 then corrects collectively either of the even diagnostic images or the odd diagnostic images on the basis of the phase correction maps generated for each of the receive channels. In this process, for example, the MRI data processor 42 combines the phase correction maps using the Sum of Squares method or the like so as to generate a combined phase correction map, and corrects either of the even diagnostic images or the odd diagnostic images using the combined phase correction maps. For example, as shown in FIG. 8, the MRI data processor 42 corrects collectively the odd diagnostic images generated for each of the receive channels.

In this process, for example, instead of generating phase correction maps for each of the receive channels and then combining the phase correction maps, the MRI data processor 42 may generate a phase correction map based on a plurality of reference data acquired from each of the receive channels, a plurality of even/odd lines data generated for each of the receive channels, or a plurality of even/odd diagnostic images generated for each of the receive channels. Alternatively, for example, the MRI data processor 42 may use a part of the receive channels. The part of the receive channels herein may be one receive channel or may be a plurality of receive channels.

Further, the MRI data processor 42 corrects individually either of the even diagnostic images or the odd diagnostic images on the basis of the magnitude correction maps generated for each of the receive channels. For example, as shown in FIG. 9, the MRI data processor 42 corrects each of the odd diagnostic images using the corresponding magnitude correction map with respect to each of the receive channels.

The MRI data processor 42 then combines the odd diagnostic image being corrected (correction image) and the even image being not corrected so as to generate a combined diagnostic image for each of the receive channels. Further, the MRI data processor 42 combines the combined diagnostic images using the Sum of Squares method or the like so as to generate a final diagnostic image.

Although the example has been described in which the odd diagnostic images are corrected, the even diagnostic images may be corrected. In this case, the MRI data processor 42 corrects collectively the even diagnostic images generated for each of the receive channels using the combined phase correction map. Further, the MRI data processor 42 corrects each of the even diagnostic images using the corresponding magnitude correction map with respect to each of the receive channels. the MRI data processor 42 then combines the even diagnostic image being corrected and the odd image being not corrected so as to generate a combined diagnostic image for each of the receive channels, and combines the combined diagnostic images so as to generate a final diagnostic image.

Further, although the example has been described in which 2D phase correction maps and 2D magnitude correction maps are generated, these correction maps may be 1D correction data. In other words, the correction information may be data that includes the correction values being along one dimension direction. For example, the correction data of the phase differences is data in which each of the phase differences is assigned as the correction value to each of the pixels along the readout direction. On the other hand, for example, the correction data of the magnitude differences is data in which each of the magnitude differences is assigned as the correction value to each of the pixels along the readout direction. In this case, for example, as shown in FIGS. 5A and 5B, the correction value of each of the pixels may be determined by fitting the variation of the phase differences in the readout direction to the spatial function as previously described.

The correction data of the phase differences and the correction data of the magnitude differences may be generated separately or may be generated as one correction map by adding both correction data. In such cases that the correction data includes the correction values being along one dimension direction, the same correction values are used for another direction perpendicular to said one dimension direction. For example, in a case where the correction data includes the correction values being along the readout direction, the same correction value is used for the same position in the readout direction with respect to the phase encode direction.

In the above examples, the phase correction map and the magnitude correction map are generated based on the reference data acquired by the prescan. According to the examples, as the phase correction map is generated by performing the prescan, in a case where a plurality of imagings are performed in the main scan, it is possible to reuse one phase correction map between the plurality of imagings and which is very efficient. For example, when diffusion images are imaged using the EPI method, generally, a plurality of imagings are successively performed varying at least one of b-value and a direction of MPG (Motion Probing Gradient) pulses. For example, when such diffusion images are imaged in the main scan, in each of the plurality of the imagings, each of the images are corrected using a phase correction map obtained by a prescan.

Further, in the above examples, a pulse sequence executed in the prescan is set so that at least a condition related to a readout gradient magnetic field is substantially the same as in a pulse sequence executed in the main scan. Further, for example, in a pulse sequence executed in the prescan, spatial resolution in the phase encode direction is set lower than that in the main scan. In other words, in a pulse sequence executed in the prescan, phase encoding amount is set smaller than that in the main scan. For example, the phase encoding amount is set to be zero, 1D correction information along the readout direction is obtained. Further, for example, when the diffusion images described above are imaged in the main scan, the MPG pulses are not applied in the prescan, because the MPG pulses may be a factor that reduces a S/N ratio.

Further, for example, when a plurality of imagings are not performed in the main scan, it is not necessarily to execute the prescan. In this case, for example, the correction imaging, such as the phase correction map and the magnitude correction map, is generated based on diagnostic data acquired by the main scan.

Further, although the example has been described in which the correction map or the correction data is generated as the correction information, it is not necessarily to generate the correction information. The MRI data processor 42 may correct the diagnostic image by generating a correction function based on the phase differences and the magnitude differences and performing calculation processing using the generated function.

FIG. 10 illustrates sketches of an example even diagnostic image 602, an odd diagnostic image 604, and a final diagnostic image 608 according to conventional techniques of Nyquist ghost reduction. In even diagnostic image 602, the object 610a is overlapped by ghost components 614a and 616a. The magnitude signal, however, is evenly or substantially evenly distributed throughout at least the areas of 610a, 612a, and 614a of even diagnostic image 602. Odd diagnostic image 604, in a manner similar to even diagnostic image 602, may have object 610b and ghost components 614b and 616b. In addition, the illustrated groupings of "+" and "−" indicate the relative brightness throughout odd diagnostic image 604. In the example sketch, the distribution of "+" and "−" indicates that the odd diagnostic image 604 is too bright on the right side of the image.

Final diagnostic image 608 is an example illustration of the result when even diagnostic image 602 is combined with odd diagnostic image 604 according to conventional techniques. Although image 608 may have corrected for phase differences as done by conventional techniques, it has not been corrected for magnitude error as described in this disclosure. As a result, final diagnostic image 608 may still have ghost components 614c and 616c that are visible in addition to object 610c. Moreover, as illustrated by the "+" and "−" distribution in 608, final diagnostic image 606 is still brighter on the right side relative to its left side. The difference in brightness may be based upon the difference in brightness in odd diagnostic image 604 which remained uncorrected when the even and odd diagnostic images were combined to yield the final diagnostic image 608. Thus, as illustrated, conventional correction of phase differences do not eliminate the ghost components.

Figure 11:
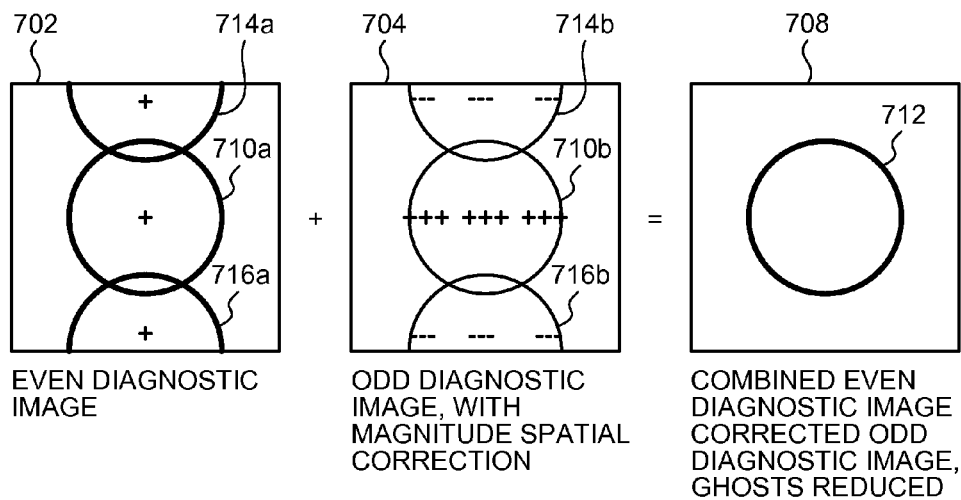
FIG. 11 illustrates example sketches of diagnostic images after reducing ghost artifacts, in accordance with some embodiments.

FIG. 11 illustrates sketches of an example even diagnostic image 702, an odd diagnostic image 704, and a final diagnostic image 708 according to some embodiments. Even diagnostic image 702 is the same as even diagnostic image 602, and represents an image generated from the same even lines as image 602. Thus, as described in relation to image 602, object 710a is overlapped by ghost components 714a and 716a, and the magnitude signal is evenly or substantially evenly distributed throughout at least the areas of 710a, 714a, and 716a. Odd diagnostic image 704, in contrast to the uncorrected image 604, has been corrected spatially for magnitude differences at least in the areas of object 710b and ghost components 714b and 716b. The illustrated groupings of "+" and "−" indicate that even diagnostic image 704 has been corrected to have equal distribution of brightness from left to right of the image at least in the areas of the 710a, 714a, and 716a. Of course, this simple description applies properly to the simple illustrative example where the underlying image should be uniform. But the same argument and results hold equally well for images such as actual anatomy with spatially dependent correct pixel values, if we adapt the description to the relative brightness between the even and odd images, as opposed to absolute brightness differences from left to right, etc.

Final diagnostic image 708 illustrates that the combination of uncorrected even diagnostic image 702, and odd diagnostic image 704 corrected spatially for magnitude differences yield a diagnostic image in which object 712 is visible but in which magnitude differences have been eliminated or have been substantially reduced when compared to image 608 in which magnitude was not spatially corrected. As described earlier in this disclosure, one or more techniques of ghost artifact removal may be applied to an image in order to eliminate or to substantially eliminate the ghost artifacts from diagnostic images. Thus, it will be understood by persons of skill in the art, that the illustration of FIG. 11 may include applying conventional techniques, such as conventional techniques in phase difference correction, to even and odd diagnostic images before and/or after combining together in order to reduce ghost artifacts. The spatial correction of magnitude differences in accordance with embodiments of this disclosure further improve the final diagnostic images by, for example, further reducing the appearance of ghost artifacts.

Applying the complex correction map can be done simple multiplication or by simple division of the even or odd image, depending upon exactly how the difference ratio is constructed, and may be an excellent approximation when the ratio does not deviate far from the value of unity. In another embodiment, the ratio map incorporating unequal magnitudes can be evaluated at each pixel and the location(s) of any aliased pixel, and used to generate an exact simultaneous inversion operation, similar to Chen's method of correcting phase maps. This simultaneous inversion from uncorrected pixels and their aliases, to corrected pixels and their aliases, is potentially more accurate when the difference between even and odd signals is greater.

As will be appreciated, the above embodiments provide MR imaging with reduced ghosting artifacts, by specifically including the magnitude term in a difference correction map and using the magnitude term to correct one of the odd or even images before the odd and even images are combined.

Among other aspects, specifically including the magnitude term in a spatially varying correction, embodiments effectively, and without a separate reconstruction, correct for frequency response non-flatness such as the magnitude variation that occurs as the receive frequency moves away from the center frequency of the receive coil.

A person of skill in the art will understand that, based upon this disclosure, the techniques disclosed herein can be extended to three dimensional (3D) acquisitions and reconstruction of MR signals, such as in EPI where there are 2 dominant readout polarities.

A person of skill in the art will understand that another extension is to acquisitions which utilize more than one segment of EPI readout. For example, the Gradient and Spin Echo (GRASE) sequence can be considered as a series of EPI readouts, each separated by an RF refocusing pulse. One approach to extending this correction to the readouts of GRASE, can be to generate a very low resolution PE prescan data set making use of an alternated gradient echo portion of the data. The subimages generated from even and odd main scan data, which, for example, are the GRASE equivalents of FIG. 6, may exhibit more complicated aliasing patterns, but the overall ability to reduce ghosts from two readout polarities remains.

Yet another extension, is to acquisitions with parallel imaging acceleration, similar to the phase correction in Xu. In parallel imaging reconstructions, it may not be required to apply multiplicative corrections directly to partially reconstructed intermediate images. Alternatively, multiplicative corrections can be incorporated indirectly, by applying them to coil sensitivity map data before the folding matrix inversion which is the basis of the SENSE algorithm. Thus, applying multiplicative magnitude factors to coil maps, as opposed to folded intermediate images, is an alternative embodiment, and may be used, for example, when magnitude correction terms have true 2D spatial dependence, because the coil maps are unaliased. Simple pixel-by-pixel multiplication can be done without regard to the parallel imaging aliasing arising from undersampling of the main acquisition data. In this extension, coil sensitivity maps are associated with even and odd data subsets, and a correction map containing both magnitude and phase information may be applied to one of the even or odd pseudocoils, but not the other.

Other advantages include that embodiments may not require new information to be acquired from the object or the scanner beyond what is already used in 2D phase correction. For example, embodiments may not require knowledge of receiver bandwidth, or off-center FOV in the readout direction. Likewise, embodiments may not require hardware or service pre-calibration (of, for example, RX channels or coil elements) beyond what is used in 2D phase correction. Also, embodiments may compensate for magnitude deviations such as a more general 2D magnitude correction that occur, for example, when a receive channel sees signal from some inductively coupled coils where each RF coil could have distinct Q etc. and resonance, so the combined coupled sensitivity of the receive channel could be a true 2D function, including aspects of the 2D RF sensitivity pattern of each coil.

Moreover, embodiments may correct for incidental slice dephasing signal loss, such as that from cross-gradient terms, Maxwell terms, or from spatially dependent eddy current terms, to the extent that they can influence signal magnitude. Additionally, by estimating in 2D, embodiments avoid many other incidental forms of signal cancelation, as might be seen in k-space peak, in 1D projections, or in combined coil data, or in DWI sensitized data with non-rigid-body motion. Estimation from the 2D data (e.g., even/odd ratios in a 2D image pair from a single acquisition, either with or without subsequent fitting to 1D) may be more robust than fitting a k-space peak, in 1D projections, or in combined coil data, or in DWI sensitized data with non-rigid-body motion.

Further advantages may include not intrinsically limiting the correction to a linear frequency dependent term. Rather, embodiments may correct for more generalized frequency function, including possibly "bumps" in analog filter or digital filter response in the RX chain. Also, by deriving the magnitude modulation from RX coil frequency non-flatness during actual imaging conditions, embodiments may avoid problems that occur where a coil is "calibrated" with one set of loading and coupling conditions, and subsequently used to "image" (e.g., main scan), with different loading, and with a different Q or different effective tuning.

It is now common to pre-combine multiple tuned hardware receiver coil loops into a single effective receiver (RX) channel. This is typically to reduce hardware costs, and to reduce the amount of data which needs to be collected, stored, and reconstructed. (e.g., fewer RX channels can lead to shorter reconstruction times.) If multiple coils are combined, especially prior to RX digitization, then applying a frequency correction to a single effective RX channel may not be optimal. The frequency correction which is best for one "loop" will not be right for another loop, when they exhibit slightly different resonant frequencies and slightly different "Q". Preventing these differences between combined loops may not be possible with practical coil design. But, because embodiments herein may allow for 2D spatially varying corrections, and because the distinct coils (before combination) have distinct positional locations, such embodiments may allow for coil correction which may be much closer to optimal, as it can provide a correction in one 2D sub region which is more suitable for one coil loop, and it can use other correction values in other regions which are more suitable for some other coil loop, etc.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   sequence controlling circuitry that executes a pulse sequence which applies a excitation pulse and then continuously applies a readout gradient magnetic field with alternating polarity thereof and acquires echo signals continuously generated by the pulse sequence from a plurality of receive channels; and
   image generating circuitry that corrects the echo signals so as to generate an image, wherein the image generating circuitry corrects the echo signals for all of the receive channels collectively on the basis of phase differences between echo signals corresponding to even lines of k-space and echo signals corresponding to odd lines of k-space, and corrects the echo signals for each of the receive channels individually on the basis of magnitude differences between echo signals corresponding to the even lines of k-space and echo signals corresponding to the odd lines of k-space.

2. The magnetic resonance imaging apparatus according to claim 1, wherein the image generating circuitry corrects the echo signals for all of the receive channels collectively on the basis of the phase differences and corrects the echo signals for each of the receive channels individually on the basis of the magnitude differences so as to generate a corrected image for each of the receive channels, and combines generated corrected images so as to generate the image.

3. The magnetic resonance imaging apparatus according to claim 2, wherein the image generating circuitry generates an even image based on the echo signals corresponding to the even lines and generates an odd image based on the echo signals corresponding to the odd lines for each of the receive channels, corrects either of the even image or the odd image on the basis of the phase differences and the magnitude differences, and combines the image being corrected and the image being not corrected so as to generate the corrected image.

4. The magnetic resonance imaging apparatus according to claim 1, wherein the image generating circuitry generates phase correction information including correction values corresponding to the phase differences and magnitude correction information including correction values corresponding to the magnitude differences, and corrects the echo signals for all of the receive channels collectively on the basis of the phase correction information and corrects the echo signals for each of the receive channels individually on the basis of the magnitude information so as to the image.

5. The magnetic resonance imaging apparatus according to claim 4, wherein the phase correction information includes the correction values being along two dimensional directions.

6. The magnetic resonance imaging apparatus according to claim 4, wherein the magnitude correction information includes the correction values being along one dimensional direction.

7. The magnetic resonance imaging apparatus according to claim 4, wherein
the sequence controlling circuitry sequentially executes a prescan and a main scan as a scan in which a pulse sequence is executed, wherein the pulse sequence applies a excitation pulse and then continuously applies a readout gradient magnetic field with alternating polarity thereof and acquires echo signals continuously generated by the pulse sequence from a plurality of receive channels, and
the image generating circuitry corrects echo signals acquired by the main scan on the basis of phase differences and magnitude differences between echo signals acquired by the prescan.

8. The magnetic resonance imaging apparatus according to claim 7, wherein a pulse sequence executed in the prescan is set so that at least a condition related to a readout gradient magnetic field is substantially the same as in a pulse sequence executed in the main scan.

9. The magnetic resonance imaging apparatus according to claim 7, wherein the sequence controlling circuitry set a size of a field of view so that aliasing arising from the echo signals acquired by the prescan is reduced.

10. The magnetic resonance imaging apparatus according to claim 7, wherein the pulse sequence applies a single excitation pulse so as to acquire the echo signals.

11. A magnetic resonance imaging method comprising:
executing a pulse sequence which applies a excitation pulse and then continuously applies a readout gradient magnetic field with alternating polarity thereof and acquiring echo signals continuously generated by the pulse sequence from a plurality of receive channels; and
correcting the echo signals so as to generate an image, wherein the echo signals are corrected for all of the receive channels collectively on the basis of phase differences between echo signals corresponding to even lines of k-space and echo signals corresponding to odd lines of k-space, and the echo signals are corrected for each of the receive channels individually on the basis of magnitude differences between echo signals corresponding to the even lines of k-space and echo signals corresponding to the odd lines of k-space.

* * * * *